(12) United States Patent
Pivovar et al.

(10) Patent No.: US 11,574,094 B2
(45) Date of Patent: Feb. 7, 2023

(54) RAPID DIGITAL NUCLEAR REACTOR DESIGN USING MACHINE LEARNING

(71) Applicant: BWXT Advanced Technologies LLC, Charlotte, NC (US)

(72) Inventors: Ross Evan Pivovar, Lynchburg, VA (US); Ryan Trigg Swanson, Lynchburg, VA (US)

(73) Assignee: BWXT Advanced Technologies LLC, Charlotte, NC (US)

( * ) Notice: Subject to any disclaimer, the term of this patent is extended or adjusted under 35 U.S.C. 154(b) by 330 days.

(21) Appl. No.: 16/895,076

(22) Filed: Jun. 8, 2020

(65) Prior Publication Data

US 2020/0387653 A1    Dec. 10, 2020

Related U.S. Application Data

(60) Provisional application No. 62/859,159, filed on Jun. 9, 2019.

(51) Int. Cl.
*G06N 20/00* (2019.01)
*G06F 30/27* (2020.01)

(52) U.S. Cl.
CPC ............. *G06F 30/27* (2020.01); *G06N 20/00* (2019.01)

(58) Field of Classification Search
CPC .............................. G06N 20/00; G06F 30/12
See application file for complete search history.

(56) References Cited

U.S. PATENT DOCUMENTS

| 5,655,110 A | 8/1997 | Krivokapic et al. |
| 5,859,773 A | 1/1999 | Keeler et al. |
| 7,555,092 B2 | 6/2009 | Russell, II et al. |

(Continued)

OTHER PUBLICATIONS

S. Ahsan, "Machine Learning Based Fault Prediction System for the Primary Heat Transport System of Candu Type Pressurized Heavy Water Reactor," 2013 International Conference on Open Source Systems and Technologies (ICOSST), IEEE, 2013 (Year: 2013).*

(Continued)

*Primary Examiner* — Eric J Yoon
(74) *Attorney, Agent, or Firm* — Morgan, Lewis & Bockius LLP

(57) ABSTRACT

A method designs nuclear reactors using design variables and metric variables. A user specifies ranges for the design variables and threshold values for the metric variables and selects design parameter samples. For each sample, the method runs three processes, which compute metric variables for thermal-hydraulics, neutronics, and stress. The method applies a cost function to compute an aggregate residual of the metric variables compared to the threshold values. The method deploys optimization methods, either training a machine learning model using the samples and computed aggregate residuals, or using genetic algorithms, simulated annealing, or differential evolution. When using Bayesian optimization, the method shrinks the range for each design variable according to correlation between the respective design variable and estimated residuals using the machine learning model. These steps are repeated until a sample having a smallest residual is unchanged for multiple iterations. The final model assesses relative importance of each design variable.

20 Claims, 8 Drawing Sheets

(56) References Cited

U.S. PATENT DOCUMENTS

| | | | |
|---|---|---|---|
| 2003/0086520 A1 | 5/2003 | Russell et al. | |
| 2009/0164953 A1* | 6/2009 | Kim | G06F 30/20 |
| | | | 716/132 |
| 2018/0011949 A1* | 1/2018 | Jusselme | G06F 30/20 |
| 2019/0392959 A1* | 12/2019 | Sun | G21C 17/108 |
| 2021/0191347 A1* | 6/2021 | Bischoff | G05B 13/0265 |

OTHER PUBLICATIONS

H. Albahadili, "FBRSim: A Fast Breeder Reactor Thermal-Hydraulic Simulator," Proceedings of the 1st International Nuclear and Renewable Energy Conference (INREC10), Mar. 21-24, 2010 (Year: 2010).*

M. Boroushaki, M, "Identification and Control of a Nuclear Reactor Core (VVER) Using Recurrent Neural Networks and Fuzzy Systems," IEEE, 2003 (Year: 2003).*

Y. Zeng et al., "Machine learning based system performance prediction model for reactor control," Annals of Nuclear Energy, published Nov. 28, 2017. (Year: 2017).*

International Search Report and Written Opinion dated Oct. 5, 2020 in International Application No. PCT/US20/36726.

International Preliminary Report on Patentability dated Dec. 14, 2021 in International Application No. PCT/US20/36726.

Nocedal et al., Numerical Optimization, 2nd ed., Springer Series in Operational Research and Financial Engineering, Eds. Mikosch et al., New York Springer Science+Business Media, LLC (2006); ISBN: 0387303030, Chapters 4 and 6.

Whitley, "A Genetic Algorithm Tutorial", Technical Report CS-93-103 (Revised), Colorado State University, Dept. of Computer Science (1993), 38 pages.

Hernandez et al., "Selecting Random Latin Hypercube Dimensions and Designs Through Estimation of Maximum Absolute Pairwise Correlations", Proceedings of the 2012 Winter Simulation Conference (2012), 12 pages.

Touran et al., "Computational Tools for the Integrated Design of Advanced Nuclear Reactors", Engineering 3 (2017), 518-526.

* cited by examiner

FIG. 4B

| CORRELATIONS | Res | INlet_T | T_max | dP/P | Keff |
|---|---|---|---|---|---|
| Res | 1 | | | | |
| INlet_T | -0.13 | 1 | | | |
| T_max | 0.42 | -0.64 | 1 | | |
| dP/P | 0.95 | 0.09 | 0.12 | 1 | |
| Keff | 0.19 | -0.1 | 0.2 | 0.14 | 1 |

Scale: 1, 0.8, 0.6, 0.4, 0.2, 0, -0.2, -0.4, -0.6, -0.8, -1 (440)

RAPID DIGITAL NUCLEAR REACTOR DESIGN USING MACHINE LEARNING

RELATED APPLICATION DATA

This application is based on and claims priority under 35 U.S.C. § 119 to U.S. Provisional Application No. 62/859,159, filed Jun. 9, 2019, the entire contents of which are incorporated herein by reference.

TECHNICAL FIELD

The disclosed implementations relate generally to the design of nuclear reactors and more specifically to systems, methods, and user interfaces that utilize machine learning to produce viable designs quickly.

BACKGROUND

In the discussion that follows, reference is made to certain structures and/or methods. However, the following references should not be construed as an admission that these structures and/or methods constitute prior art. The Applicant expressly reserves the right to demonstrate that such structures and/or methods do not qualify as prior art against the present invention.

A design for a nuclear reactor core must satisfy complex interactions of physics disciplines. For example, the design requires neutronics that sustain criticality (fission reactions), which is also dependent on fuel and moderator properties. A design also requires thermal properties such as heat flux profile, conductivity, and output. In addition, a design must satisfy stress analyses for the assembly's integrity and material properties that will not melt or split apart under the stresses of energy flux and cycling.

Testing the neutronics case with Monte Carlo N-Particle Transport Code (MCNP) or other validated simulators often takes days for a single design, after which thermal and stress simulations or calculations must also be run. Finding a valid combination of design parameters for a particular geometry can take months. Historically, attempts to speed up this process has taken the form of: (i) adding computing power and/or using supercomputers; (ii) accelerating the computations, such as using a GPU computing development; and/or (iii) utilizing top end software, which treats inefficiencies in workflow and format compatibility, and may deploy an alternative but non-validated solver. However, the processes are still very slow, and often take months to determine that a proposed design does not satisfy all of the requirements. In addition, some systems attempt to increase fidelity or further integrate physics-based Modeling and Simulation software, often via government labs, with expensive development, which often slows down the process even further.

SUMMARY

The current disclosure uses an Artificial Intelligence (AI) suite to find optimal design space within user specified constraints, which provides: (i) rapid, automated assessment of conceptual reactor designs; (ii) identifies a valid parameter space and optimal parameters that satisfy neutronic, thermal-hydraulic, and stress requirements; and (iii) synthesizes and analyzes results to facilitate decision making.

Some implementations provide a global population-based algorithm, which applies a heuristic-based process using machine learning for optimization of an entire design space, for example for the active core region of a nuclear fission reactor. Implementations of the algorithm (i) adaptively screen and/or remove insignificant variables to accelerate convergence on the optimal design solution; and (ii) systematically assess complex multivariate interactions during the optimization, which is also used to generate reports that assess the limiting constraints for decision making (design requirement analysis) and detailed core understanding (design analysis). Some implementations within the suite of options apply the same techniques in combination with a genetic algorithm, a coupled simulated annealing algorithm, or a differential evolution algorithm to provide evolutionary optimization.

Disclosed implementations use machine learning-based algorithms to rapidly identify and optimize design options simultaneously along mission and engineering constraints by machine learning-informed stochastic sampling across physics disciplines. By sampling the response space and learning the topology, recursively refining each parameter for potential candidate sub-regions according to a cost function identifies a final valid design space and outputs valid design options to the user, along with analytics to investigate trade-offs and characteristics of valid designs. During the process, the "trust region" for the design parameters is initially specified by a user, and generally reduced in size during each iteration. The trust region converges to the final design space.

The design subspace is non-spherical and refined based on user-defined baseline choices and constraints. Disclosed implementations employ multiphysics analysis (neutronics, thermal-hydraulic analysis, and stress analysis) in a sampling mode, using relatively quick runs. This includes a solver directed to modeling effective neutron multiplication factor (k-effective or $K_{eff}$) to discover gradients of the various design variables that tend toward an optimal design space. Once a valid design space is identified, only the preferred design choices with a high likelihood of validity need undergo further validation with a high-fidelity run (e.g., using MCNP or other high-fidelity simulations that model the reactor core for neutronics, thermal, and/or stress analyses). The disclosed process avoids use of otherwise costly computing resources, compute delay, and individual subject-matter expert engineering time. The disclosed processes reduce exercising these resources on invalid designs, ultimately adding flexibility and customization.

The disclosed methods provide the ability to understand (within the time frame of hours) interactions too complex for a human to explicitly process. The disclosed approach offers more than a single design that meets design criteria. Rather, the disclosed approach operates during the running of the computer analysis without interrupting the run and analyzes trade-offs between multiple designs that naturally arise with evolving design discovery and a spectrum of design inputs and changing mission profiles.

In accordance with some implementations, a method executes at a computing system. Typically, the computing system includes a plurality of computers, each having one or more processors and memory. The method is used to design nuclear reactor cores. The design process uses a plurality of design variables for a nuclear reactor. The design variables are essentially the independently controlled variables. In addition, the design process uses a plurality of metric variables related to the nuclear reactor. The metric variables include, for example, variables to measure thermal-hydraulic properties, variables to measure neutronics properties, and variables to measure stress properties. The metric variables are essentially the dependent variables, which measure the viability of a design. Other metric variables can also be used.

A user specifies a respective range of values (including material selections from a material database) for each of the design variables, thereby forming an initial trust region. The trust region is initially a hypercube, centered at a point whose coordinates are the averages of each of the ranges. The user also specifies a respective constraint value for each of the metric variables. For example, the maximum fuel temperature or maximum pressure drop.

The method constructs a Latin hypercube comprising N samples of values for the design parameters within the initial trust region. The Latin hypercube is constructed so that it minimizes the multivariate correlation between the design variables. The process minimizes the correlation in potentially two ways: (i) increasing the number of samples, and/or (ii) selecting alternative samples. N is an integer greater than 1 (e.g., 10, 25, or 50).

For each of the N samples in the Latin hypercube, the method performs several actions: (i) executing a thermal-hydraulics analysis process to compute the plurality of metric variables that measure thermal-hydraulic properties; (ii) executing a neutronics analysis process to compute the plurality of neutronics metrics corresponding to the neutronics properties; (iii) executing a stress analysis process to compute the plurality of metric variables corresponding to the stress (and related) properties; and (iv) applying a cost function to compute a respective aggregate residual of the metric variables compared to the target (threshold) values for the metric variables.

The method then trains a machine learning model according to the N samples and the corresponding computed aggregate residuals. Various machine learning techniques can be used. In some implementations, the machine learning model is a random forest of decision trees. In some implementations, the machine learning model is a neural network. Some implementations use Gaussian processes for machine learning. In other implementations, memoryless methods for evolutionary optimization may be used. In some implementations, a suite of optimization methods is provided for selection to best meet the design problem.

The method then shrinks the trust region, centering the modified trust region at a sample point (one of the N samples in the Latin hypercube) having a smallest residual. Although the trust region starts initially as a hypercube, the trust region is generally not a hypercube as it shrinks. The respective range for each design variable is shrunk according to correlation between the respective design variable and estimated residuals using the machine learning model.

The process then repeats the constructing, executing the thermal-hydraulic processes, executing the neutronics processes, executing the stress processes, computing, and training until a sample having a smallest residual is unchanged for a predetermined number of iterations. Using the machine learning model from the final iteration, the method assesses the relative importance of each design variable and provides the assessment visually in a report. In some implementations, the report is an interactive graphical user interface with one or more data visualizations that illustrate the importance of each design variable and/or illustrate which of the metric variables imposed the greatest design limitations.

In some implementations, executing the thermal-hydraulics analysis process, executing the neutronics analysis process, and executing the stress analysis process are performed concurrently. In some implementations, there is an initial coarse screening for each of the points, and sample points that create very poor results are not fully processed (e.g., sample points with inadequate $K_{eff}$ are rejected).

In some implementations, executing the thermal-hydraulics analysis process, executing the neutronics analysis process, and executing the stress analysis process are performed serially.

In some implementations, the thermal-hydraulics analysis process, the neutronics analysis process, and the stress analysis process are each performed at respective distinct computing subsystems. In this way, the processes can be run in parallel and each computing subsystem can be optimized (e.g., hardware and/or software) for a particular type of calculations.

In some instances, the best sample point is at the border of the trust region, which indicates that an optimal solution may be outside of the current trust region. In this case, some implementations expand the trust region. Specifically, when the method determines in an iteration that the sample having the smallest residual has a value for a first design variable on a boundary of the trust region, the method expands the trust region to include a range for the first design variable that was not previously in the trust region. In some implementations, expansion of the trust region is not permitted to expand beyond the initial parameters specified by the user (e.g., expansion can undo earlier shrinking).

In some implementations, one of the metric variables is the effective neutron multiplication factor ($K_{eff}$).

In some implementations, the shrinking of the trust region uses a learning rate multiplier specified by user input.

In some implementations, the initial Latin hypercube is centered at average values for the user-specified ranges of the design variables.

The method also works when one or more of the design variables has discrete categorical values rather than numeric ranges. For example, one of the design variables may be fluid type, with categorical values, for example, "hydrogen," "helium," and "nitrogen." In some implementations, when the design variables include a first design variable that has discrete categorical values, the method further comprises: (i) encoding each distinct categorical value as a numeric value in a continuous range to form a first replacement design variable; and (ii) substituting the first replacement design variable for the first design variable.

When there are one or more categorical design variables, the method further includes, during each iteration: (i) for the sample having the smallest residual, using the machine learning model to estimate probabilities that switching to different categorical values would produce a smaller residual according to the cost function; and (ii) for the next iteration, using sampling rates for the Latin hypercube that are proportional to the probabilities. For example, some implementations normalize the probabilities so that the sum over all categorical values is 1.

In some implementations, a computing system includes one or more computers. Each of the computers includes one or more processors and memory. The memory stores one or more programs that are configured for execution by the one or more processors. The one or more programs include instructions for performing any of the methods described herein.

In some implementations, a non-transitory computer readable storage medium stores one or more programs configured for execution by a computing system having one or more computers, each computer having one or more processors and memory. The one or more programs include instructions for performing any of the methods described herein.

Thus methods and systems are disclosed that provide rapid digital nuclear design using machine learning.

The discussion, examples, principles, compositions, structures, features, arrangements, and processes described herein can apply to, be adapted for, and be embodied in nuclear reactors using any moderator system (such as water and light-elements) and any coolant system (such as water, liquid metal, molten salts, and gas).

BRIEF DESCRIPTION OF THE DRAWINGS

For a better understanding of the disclosed systems and methods, as well as additional systems and methods, reference should be made to the Description of Implementations below, in conjunction with the following drawings in which like reference numerals refer to corresponding parts throughout the figures.

FIGS. 4A-4D illustrate output analytics for nuclear reactor design in accordance with some implementations.

Reference will now be made to implementations, examples of which are illustrated in the accompanying drawings. In the following description, numerous specific details are set forth in order to provide a thorough understanding of the present invention. However, it will be apparent to one of ordinary skill in the art that the present invention may be practiced without requiring these specific details.

DESCRIPTION OF IMPLEMENTATIONS

Figure 1:
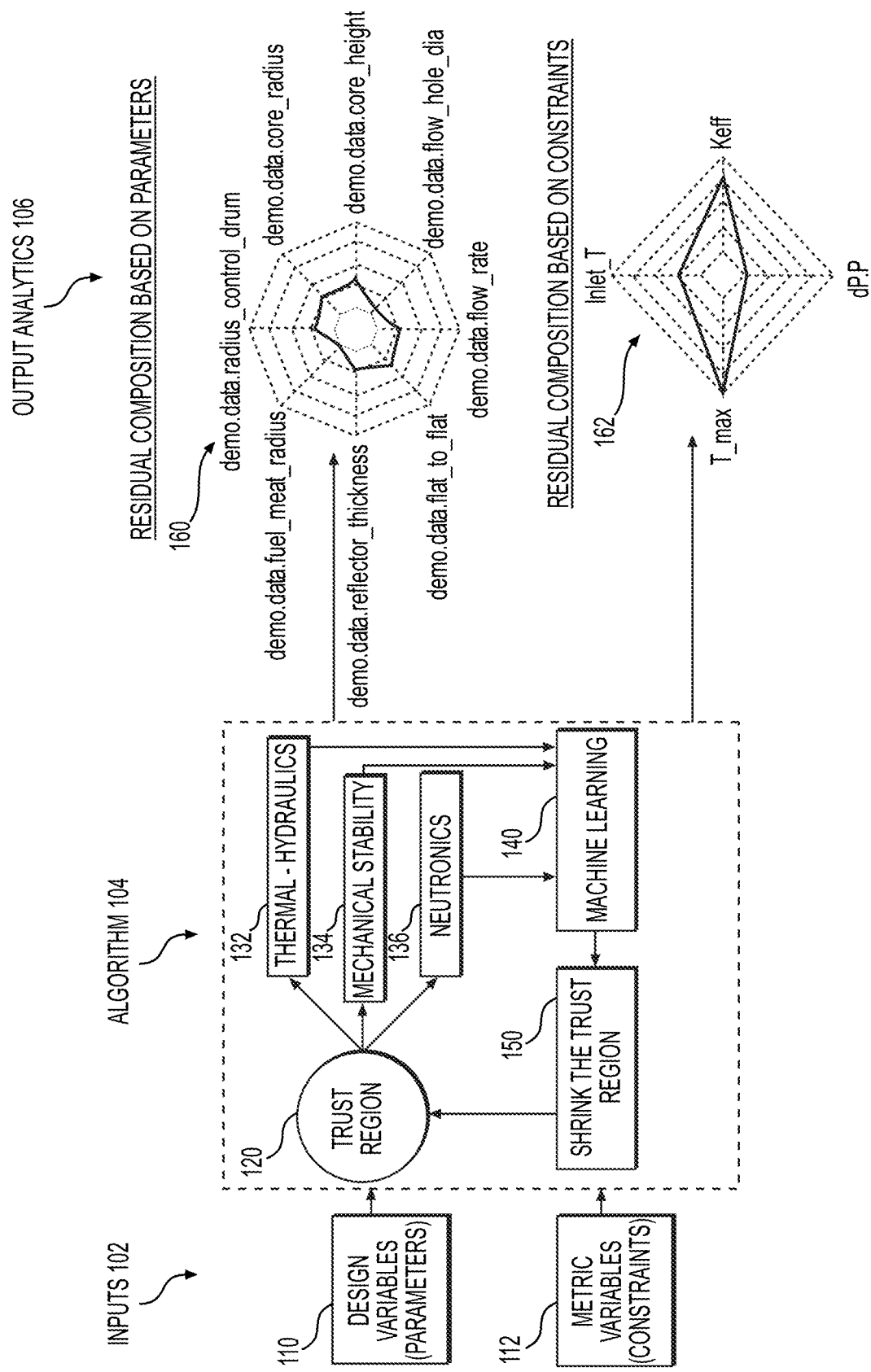
FIG. 1 provides a high-level overview of a process for designing a nuclear reactor core, in accordance with some implementations.

FIG. 1 provides a high-level overview of a process for designing a nuclear reactor core, in accordance with some implementations. The inputs 102 are provided by one or more users. In some implementations, the inputs are provided in an input user interface 222 (e.g., a graphical user interface). In some implementations, the inputs 102 are provided through a command line interface or using an input file. The inputs 102 comprise design variables 110, which are the parameters that specify physical design characteristics of a reactor core (e.g., the geometry, the operating conditions, the fuel loadings, fuel type patterns, the size, the mass, a limited list of fuel and moderator alternatives, or construction materials). The user specifies ranges of values (or lists of discrete values) for each of the design variables 110 and materials selected from a material library. The inputs 102 also include metric variables 112, which are constraints on how the reactor core functions (e.g., output Megawatts, centerline temperatures, fluid pressure drop, thrust, flow, ISP (specific impulses), total mass, component mass, poisons, or power distributions). The user specifies threshold values for the metric variables. Some constraints are fundamental, such as those related to maintaining structural integrity for an intended lifetime.

The algorithm 104 is iterative, starting with a trust region 120. From this trust region 120, a plurality of sample points are selected. In some implementations, the samples form a Latin hypercube (e.g., centered at a point whose coordinates are the average of each of the ranges). The algorithm selects the sample points so that the maximum multivariate correlation between the design variables is minimized. In some implementations, this is an iterative process that specifies a predetermined maximum value p_max, iterating until the maximum multivariate correlation is less than p_max.

After the sample points are selected, algorithm 104 runs three processes to determine the quality of each sample point. Typically these processes are run in parallel, but some implementations perform an initial screening using one or more of the processes (e.g., the neutronics engine 136) to rule out some designs that are too far from workable. Each of the thermal-hydraulics engine, 132, the mechanical stability ("stress") engine 134, and the neutronics engine 136 computes values for one or more of the metric variables 112. For each sample, the algorithm computes a cost function that specifies the quality of the sample in terms of producing a viable model for a reactor core. In some implementations, the cost function computes a residual, which is a weighted polynomial of the amount by which each of the metric variables differs from its target constraint value (threshold). For example suppose there are n metric variables $y_1, y_2, \ldots, y_n$ with target constraint values $c_1, c_2, \ldots, c_n$ and weights $w_1, w_2, \ldots, w_n$. Some implementations specify the residual as the sum $w_1(y_1-c_1)+w_2(y_2-c_2)+ \ldots w_n(y_n-c_n)$.

The sample points and computed residuals are input to the machine learning engine 140, which uses the data to build a machine learning model 262 (or multiple models). In some implementations, the model is a random forest of decision trees. In some implementations, the model is a neural network. Some implementations use Gaussian processes for the machine learning. In other implementations, memoryless methods for evolutionary optimization may be used. In some implementations, a suite of optimization methods is provided for selection to best meet the design problem. Based on the machine learning model 262, the algorithm 104 determines the relative importance of each of the design variables. Some of the design variables have a significant impact on the residual, but other design variables have little impact on the residual. Using this data, the algorithm 104 is able to shrink (150) the trust region 120 and repeat the iterative process with a smaller trust region. Because the trust region shrinks on each iteration, the algorithm 104 collects more and more information about smaller regions, and thus the data becomes more precise. Note that the cumulative sample points from all of the iterations are used when building the machine learning model 262 (e.g., if the same number of sample points are generated for the second iteration, the second iteration will have twice as many sample points in total to build the machine learning model).

In some implementations, the process uses a genetic algorithm instead of or in addition to the shrinking of the trust region in each iteration. When using a genetic algorithm, each of the sample points is weighted according to the residual. In this case, a sample with a smaller residual has a higher weight. In some implementations, a sample with a residual that is too high will have a weight of zero. These weights are used for constructing the samples used in the next iteration. For example, randomly select pairs of samples according to their weights, and for each pair, construct children samples for the next iteration using mutation and/or crossover. In some implementations, more than two samples are used to generate a child sample for the next iteration.

When the best sample point does not change after multiple iterations, the algorithm 104 exits the processing loop. The data from the final iteration is used to provide output analytics 106 for users. In some implementations, the output analytics 106 are provided as graphical data visualizations, such as the graphical data visualizations 160 and 162. The first graphical data visualization 160 shows the residual composition based on the input parameters (i.e., the design variables 110). This shows how much each of the design variables 110 contributed to the computed residuals. In this example, there are eight input parameters that contributed to the residuals, including core radius, core height, flow hole diameter, and flow rate. In some implementations, any input parameter whose contribution to the residual is less than a threshold value is omitted from the graphic 160. The second graphical data visualization 162 shows the residual composition based on the metric constraints 112. In this example data visualization 162, $T_{max}$ and $K_{eff}$ are the two most critical constraints, whereas Inlet temperature ($Inlet_T$) and pressure drop dP/P were less significant. In some implementations, these data visualizations 160 and 162 are interactive, allowing a user to investigate the options.

Figure 2:
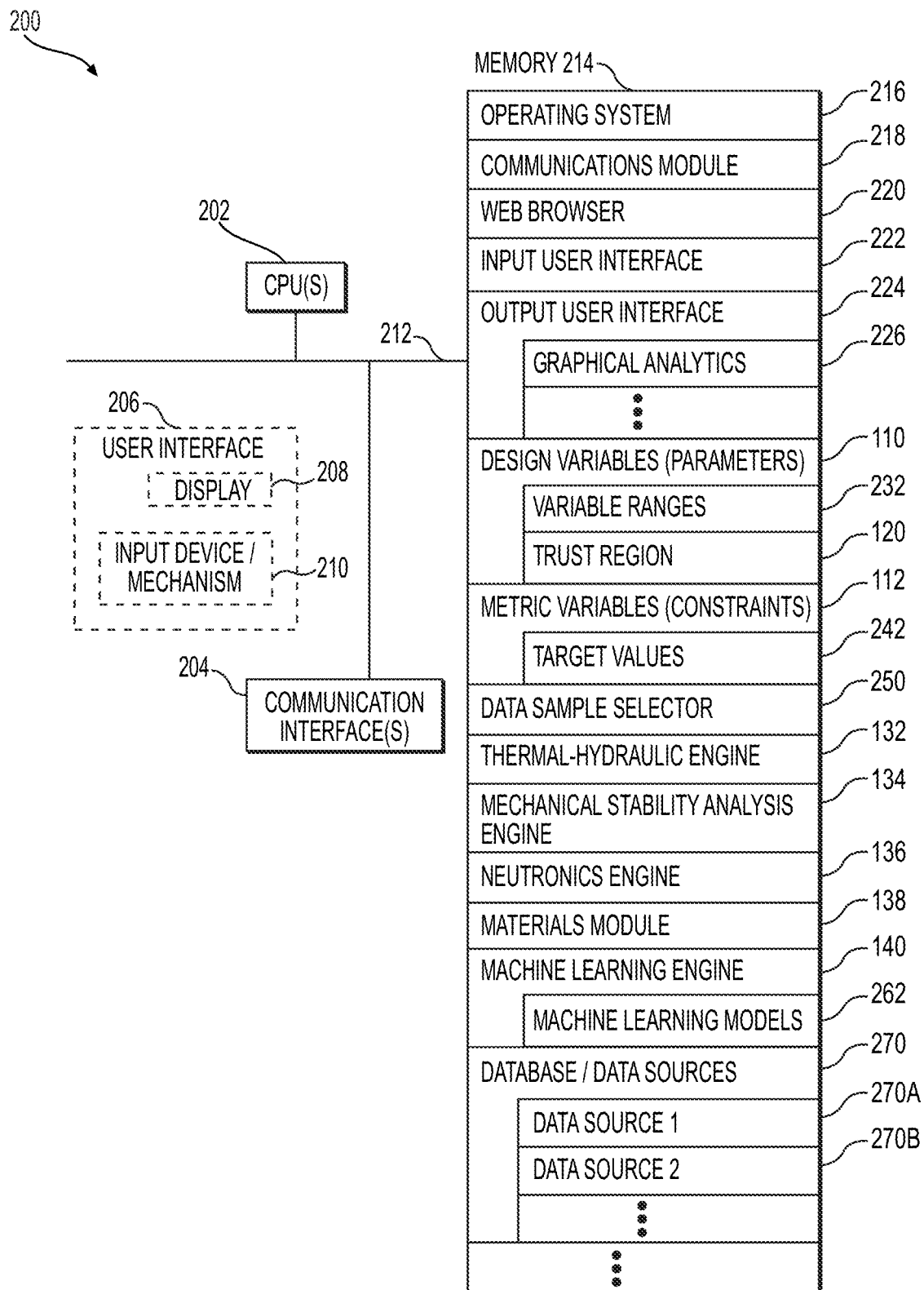
FIG. 2 is a block diagram of a computing device according to some implementations.

FIG. 2 is a block diagram illustrating a computing device 200 in accordance with some implementations. Various examples of the computing device 200 include high-performance clusters (HPC) of servers, supercomputers, desktop computers, cloud servers, and other computing devices. The computing device 200 typically includes one or more processing units/cores (CPUs) 202 for executing modules, programs, and/or instructions stored in the memory 214 and thereby performing processing operations; one or more network or other communications interfaces 204; memory 214; and one or more communication buses 212 for interconnecting these components. The communication buses 212 may include circuitry that interconnects and controls communications between system components.

The computing device 200 may include a user interface 206 comprising a display device 208 and one or more input devices or mechanisms 210. In some implementations, the input device/mechanism includes a keyboard. In some implementations, the input device/mechanism includes a "soft" keyboard, which is displayed as needed on the display device 208, enabling a user to "press keys" that appear on the display 208. In some implementations, the display 208 and input device/mechanism 210 comprise a touch screen display (also called a touch sensitive display).

In some implementations, the memory 214 includes high-speed random access memory, such as DRAM, SRAM, DDR RAM or other random access solid state memory devices. In some implementations, the memory 214 includes non-volatile memory, such as one or more magnetic disk storage devices, optical disk storage devices, flash memory devices, or other non-volatile solid state storage devices. In some implementations, the memory 214 includes one or more storage devices remotely located from the CPU(s) 202. The memory 214, or alternatively the non-volatile memory device(s) within the memory 214, comprises a non-transitory computer readable storage medium. In some implementations, the memory 214, or the computer-readable storage medium of the memory 214, stores the following programs, modules, and data structures, or a subset thereof:

- an operating system 216, which includes procedures for handling various basic system services and for performing hardware dependent tasks;
- a communications module 218, which is used for connecting the computing device 200 to other computers and devices via the one or more communication network interfaces 204 (wired or wireless) and one or more communication networks, such as the Internet, other wide area networks, local area networks, metropolitan area networks, and so on;
- a web browser 220 (or other application capable of displaying web pages), which enables a user to communicate over a network with remote computers or devices;
- an input user interface 222, which allows a user to specify ranges 232 of allowed values for the design variables 110 and to specify target (threshold) values 242 for the constraints 112. The ranges for the design variables are using to specify an initial trust region 120;
- an output user interface 224, which provides graphical analytics 226 about the designs constructed. Some examples of graphical analytics 226 are the data visualizations 160 and 162 in FIG. 1;
- a data sample selector 250, which selects a set of samples in the trust region. In some implementations, the data sample selector forms a Latin hypercube. In some implementations, the Latin hypercube is formed iteratively to reduce the multivariate correlation between the sample values for the design variables 110;
- a thermal-hydraulics engine 132, which determines various properties, such as the heat flux profile, heat transport, pressure drop, and melting. In some implementations, this uses a Finite Element method (FEM), a Finite Difference Method (FDM), or Finite Volume Method (FVM). In some implementations, this uses an ANSYS model or a high-fidelity multi-physics simulation suite (e.g., from a government laboratory), such as the MOOSE framework from Idaho National Laboratory;
- a mechanical stability analysis engine 134, which determines various mechanical properties, such as the effects of the coefficient of thermal expansion (CTE), CTE mismatch, stress-strain, cycling, and cracking;
- a neutronics engine 136, which calculates various properties, such as fission criticality, range, moderation, fluence, and sustainability. In some implementations, the neutronics engines uses Monte Carlo N-Particle simulation (MCNP,), SCALE (a modeling and simulation suite for nuclear safety analysis maintained by Oak Ridge National Laboratory), and/or Open MC (a community-developed Monte Carlo neutron and photon transport simulation code);
- a materials module 138, which evaluates materials that may be used for various components, such as the materials used for constructions, fuel, cladding, poisons or moderators. The properties evaluated may include dissipation grain structure, materials reaction properties, and states of material mixes;
- a machine learning engine 140, which builds machine learning models 262 based on the samples and the computed metrics for each of the samples. In some implementations, the machine learning engine 140 builds a random forest of decision trees. In some implementations, the machine learning engine 140 builds a neural network. In some implementations, the machine learning engine 140 uses Gaussian processes to build the machine learning models 262; and
- zero or more databases or data sources 270 (e.g., a first data source 240A and a second data source 240B). In some implementations, the data sources are stored as spreadsheet files, CSV files, XML files, flat files, HDF files, or SQL databases. The databases may be stored in a format that is relational or non-relational.

Each of the above identified executable modules, applications, or sets of procedures may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise re-arranged in various implementations. In some implementations, the memory 214 stores a subset of the modules and data structures identified above. Furthermore, the memory 214 may store additional modules or data structures not described above.

Although FIG. 2 shows a computing device 200, FIG. 2 is intended more as a functional description of the various features that may be present rather than as a structural schematic of the implementations described herein. In practice, and as recognized by those of ordinary skill in the art, items shown separately could be combined and some items could be separated.

Figure 3A:
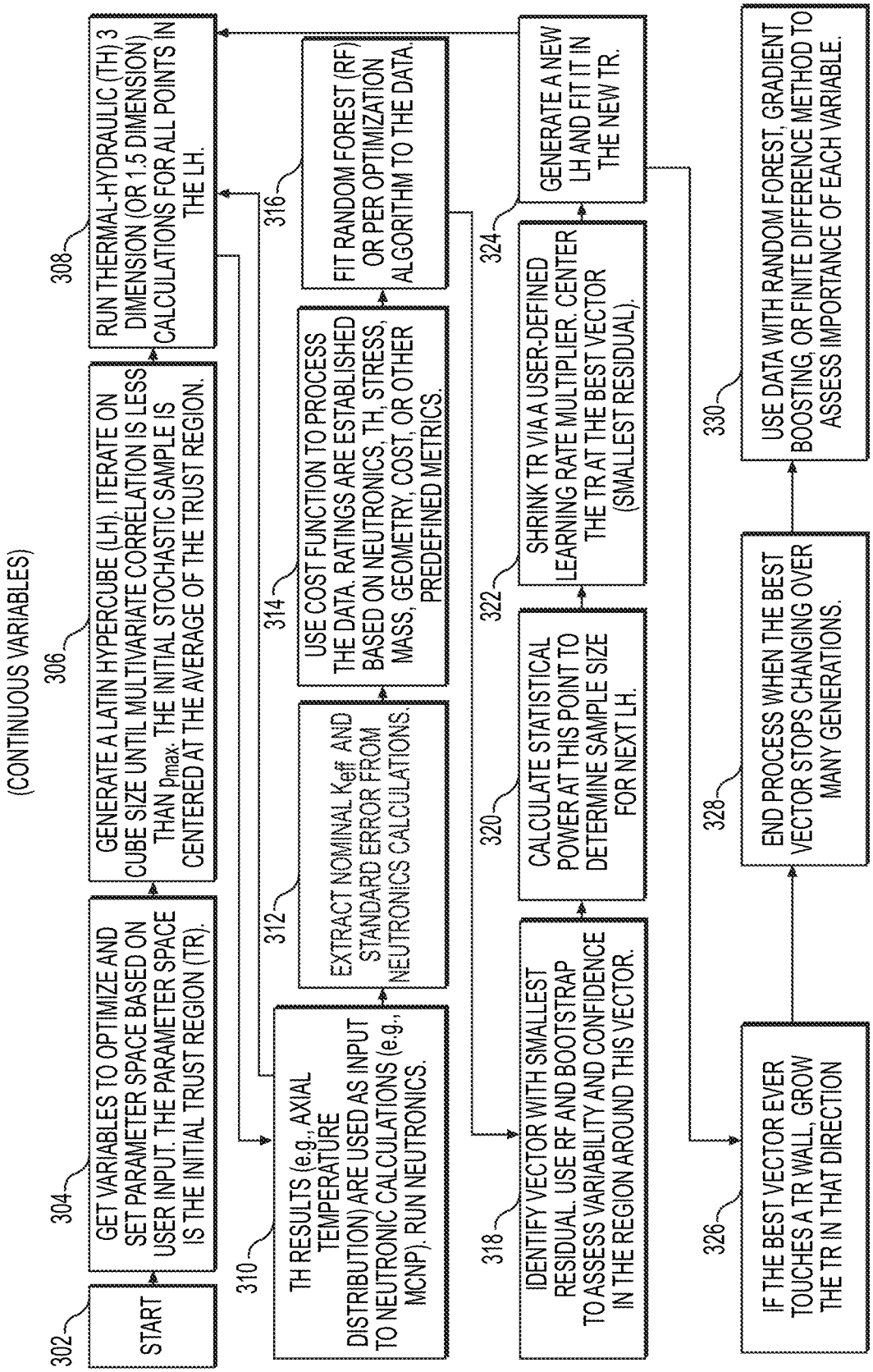
FIGS. 3A and 3B are flow charts of processes for rapid digital nuclear reactor design using machine learning, in accordance with some implementations.

FIG. 3A provides a flowchart of rapid nuclear reactor design using continuous design variables. The process starts (302) by getting (304) the variables (both design variables 110 and metric variables 112). A user specifies a range for each of the design variables 110 and specifies a constraint for each metric variable 112 (e.g., a one-sided inequality). Sometimes the design variables 110 are referred to as the parameters, and the hypercube of the ranges is referred to as the parameter space. The parameter space forms (304) the initial trust region (TR). Sometimes the space for the metric variables is referred to as the response space.

Next, the process generates (306) a Latin hypercube (LH) of samples from the initial trust region. Generating the Latin hypercube is iterative, and the process iterates (306) on the cube size until the multivariate correlation between the design variables for the samples is less than a predefined constant $p_{max}$. Each iteration increases the size of the Latin hypercube and/or replaces at least one of the samples with a new sample. The initial stochastic process for building the Latin hypercube is (306) centered at the average of the trust region.

The process then runs (308) thermal-hydraulic (TH) calculations for each of the points in the Latin hypercube. Some implementations use a 3D Finite Element Method for calculations. Some implementations use a true 2D calculation, which includes both a 2-dimensional fluids calculation (axial and radial) and a 2-dimensional heat conduction calculation (axial and radial). However, some implementations are able to produce good quality results with less than a full 2D calculation. In general, the geometries create flows that really only result in axial changes that are relevant. Thus, some implementations solve only 1D axial flow without a radial component. The reverse is true for the conduction. The radial component is very important, but the axial is not as important. Thus, some implementations solve only 1D radial conduction. In this scenario, there are solutions that are both axial and radial, but they are not true 2D calculations. Computing only the 1D axial flow and only the 1D radial conduction is sometimes referred to as "1.5D".

The output from the thermal-hydraulic calculations (e.g., the axial temperature distribution) is then then used (310) as input to the neutronic calculations and the mechanical stability analysis. The thermal-hydraulic process, neutronics process, and mechanical stability analysis compute various metric variables. In particular, the process extracts (312) nominal $K_{eff}$ and its standard error from the neutronic calculations. In some implementations, boxes 308 and 310 in this flow loop for convergence before proceeding to box 312.

The computed metric values from the multiple physics processes are then used as an input to a cost function, which measures (314) the overall quality of a sample with respect to satisfying the constraints. Even if all of the samples fail to provide viable designs for a nuclear reactor, some of the designs are better than others, and can be used to iteratively locate better designs. The metrics used by the cost function generally includes metrics based on neutronics, thermal-hydraulics, mechanical stability, mass, geometry, cost, and other factors. In some implementations, the cost function f is a weighted combination of differences between the target constraint value for each metric variable and the computed value for each metric variable, such as $\Sigma_i w_i (y_i - c_i)$, where the $w_i$ are the weights, the $y_i$ are the measured metric values, and the $c_i$ are the target constraint values.

Using the data from the cost function, the process applies (316) machine learning to build a model. In the example illustrated in this flowchart, the machine learning uses (316) a random forest (RF) of decision trees according to the samples of the design variables and the values of the cost function. The cost function simplifies the analysis by converting the data for multiple metrics into a single number (a single dimension rather than many dimensions). Some implementations fit the data according to non-Bayesian algorithms, using memoryless evolutionary optimization, such as genetic algorithms, coupled simulated annealing algorithms, or differential evolution algorithms.

Among the samples, the process identifies (318) a vector (i.e., a sample point) that creates the smallest residual (i.e., the smallest value for the cost function). The process uses the random forest and bootstraps to assess variability and confidence in the region around this vector. In particular, the process calculates (320) the statistical power at this sample point to determine the sample size n for the next Latin cube. Some implementations use Gaussian-based analysis to perform these steps. Using a Gaussian distribution often works well due to the central limit theorem. Some implementations use the following equation for a Gaussian distribution to determine the next sample size n:

$$n = MSE \cdot \frac{(Z_\alpha + Z_\beta)^2}{error^2},$$

where MSE=mean squared error of the model (e.g., using bootstrap on a random forest), $Z_\alpha$=Gaussian quantile at the alpha confidence level, $Z_\beta$=Gaussian quantile at the beta power level, and error=a constant specified by a user to indicate how small of a difference is important. The MSE specifies the confidence.

As an alternative, some implementations use a non-Gaussian distribution based on a binomial, which requires more complex equations.

Once the variability and confidence are known, the process shrinks (322) the trust region. In some implementations, the shrinkage is according to a user supplied learning rate multiplier. The shrinkage for each of the design variables is according to variability of the cost function for that design variable. The shrinkage creates (322) a new trust region centered at the best vector, and the region is generally not a hypercube. Using this new trust region and the determined sample size, the process generates (324) a new Latin hypercube of samples, and then iterates the calculations (starting at box 308) for the new Latin hypercube.

During this iterative process, the vector having the least residual can be (326) at a wall (aka border) of the trust region. When this occurs, the optimal solution may be outside the trust region, so the trust region is expanded (326) beyond the wall (e.g., expand in a direction normal to the boundary).

The iterative process continues (328) until the best vector remains the same across multiple iterations. Some implementations specify a predetermined number of generations of unchanging best vector before the process stops. For example, some implementations set the predetermined number of iterations at 3, 5, or 10.

Once the process is complete, data from the selected optimization method (e.g., data from the final random forest) is used to provide a user with analytic data about the design and metric variables. Some examples of output are illustrated by the graphics in FIGS. 4A-4D. In some implementations, the process illustrates (330) the importance of each design variable. Bayesian optimization typically uses a random forest. For non-Bayesian optimization, some implementations use gradient boosting or a finite difference method to assess the importance of each variable.

Figure 3B:
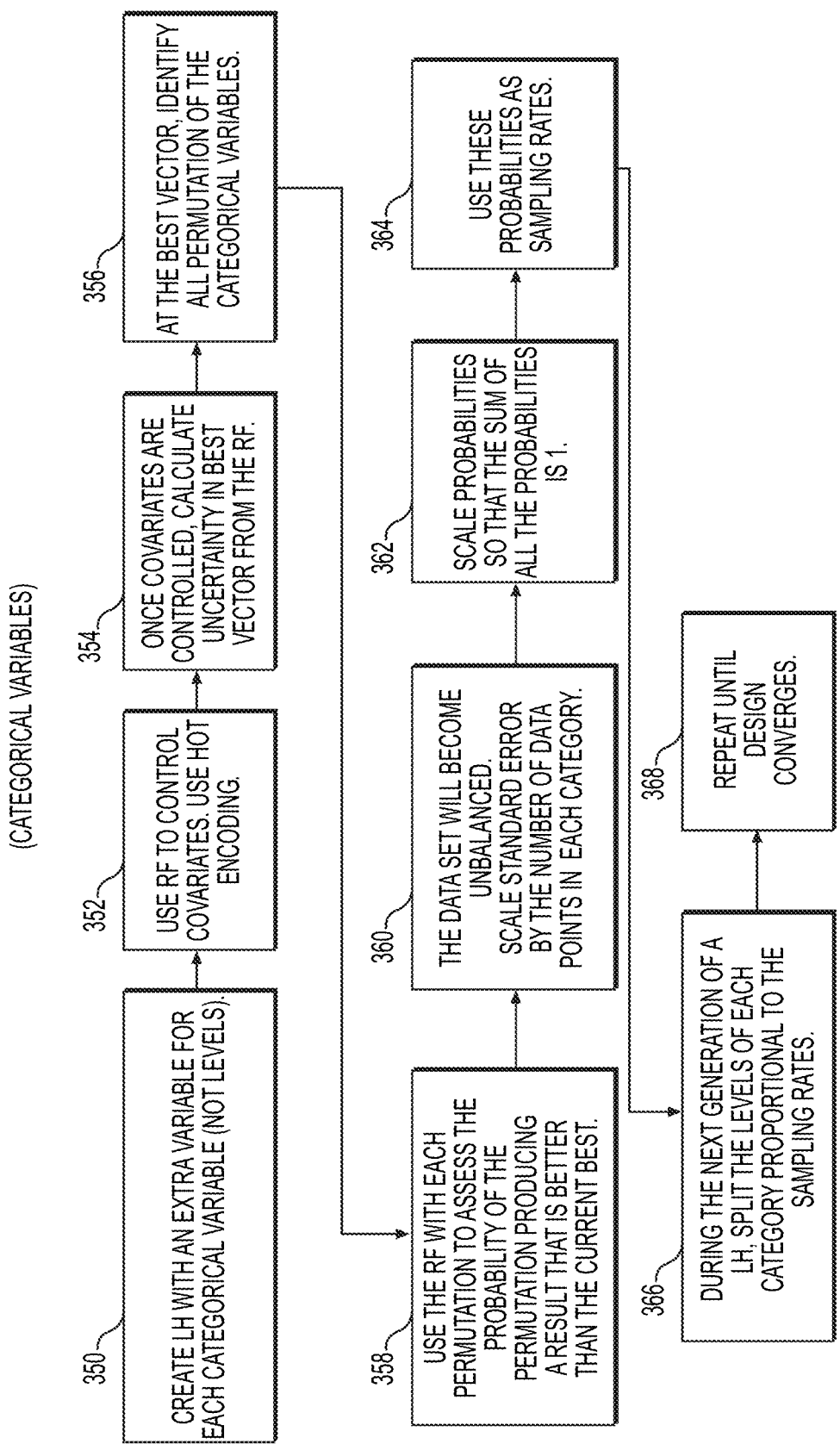

FIG. 3B illustrates how the process in FIG. 3A is expanded to include one ore more categorical design variables (in addition to the continuous numeric design variables). In this case, the Latin hypercube includes (350) an extra dimension for each of the categorical variables. Sometimes the domain of values of a categorical variable are referred to as "levels." A dimension is added to the Latin hypercube for each categorical variable, regardless of how many distinct data values there are for the categorical variable. In some implementations, this process substitutes a numeric variable for each categorical variable, and encodes of the categorical values as a number. This is sometimes referred to as "hot encoding." For example, if there is a categorical variable for fluid type, and the options are nitrogen, hydrogen, or oxygen, these three fluid types can be encoded as 1, 2, and 3 (e.g., 01, 10, and 11). The process uses the existing random forest to control (352) covariates among the design variables.

Once the covariates are controlled, the process calculates (354) uncertainty at the best vector (based on the random forest). For this best vector, the process identifies (356) all permutations of the categorical variables. The number of categorical variables is usually small, so the number of permutations is not large. Then, the process applies (358) the random forest model with each permutation to assess the probability of the permutation producing a result that is better than the current best. For this step, the process essentially builds new samples that retain all of the non-categorical variables from the best vector, and include each of the permutations of the categorical variables. Each of these new samples is assessed according to the machine learning model (e.g. random forest) to estimate the probability of producing a better result than the current best vector.

In general, there will not be the same number of sample points corresponding to each categorical value. Therefore, the process scales (360) standard error by the number of data points in each category in order to avoid mistakenly biased factors that have been downweighted. In some implementations, the probabilities are scaled (362) so that the sum of all the probabilities is 1. The process then uses (364) the probabilities as sampling rates. For example, if a certain categorical value has a higher probability of leading to a better result, it will be used in the sampling at a higher frequency than other categorical values.

The process uses (366) the computed sampling rates in the generation of the next Latin hypercube, which splits the levels of each category in proportion to the sampling rates.

In other words, take the Latin hypercube, which is setup for continuous values and "bin" the samples based on the levels in proportion to the probability values calculated by the random forest. The process then repeats (368) until it converges, as described in FIG. 3A.

The calculations for the thermal-hydraulics engine 132, the mechanical stability analysis engine 134, and the neutronics engine 136 can be performed at varying levels of fidelity. In some implementations, there are three broad levels of fidelity. At the lowest level of fidelity, samples are tested for gross fitness, and many such samples can be discarded quickly because they are not even close to satisfying the constraints. At the second level of fidelity, calculations are slower, but reasonably accurate. By limiting the number of sample points that use the second level of fidelity, the overall algorithm is able to create design spaces in a matter of hours.

The third level of fidelity is applied outside the scope of the disclosed processes. This highest level of fidelity is used to validate a design so that it meets the strict requirements specified by government regulations. Because the disclosed processes produce very good design spaces, it is expected that the highest fidelity algorithms (which may take weeks or months to run) will validate designs that are within the generated design space.

Typical high fidelity CFD calculations incorporate the interaction between fluids and solid conduction through a conjugate heating calculation. However, CFD calculations resolve the fluid boundary layer, which can be a time consuming calculation. Instead a 3D FEM conduction mesh can be coupled with a FDM 1D axial flow or 1D porous media calculation to accelerate convergence of a physics solution. Coupling is achieved by implementing a pseudo-time step and iterating on the FEM/FDM convergence. Many design calculations desire either pressure equalization across all flow channels or flow must be searched on to achieve a desired boundary condition criteria. This flow searching or pressure equalization can also be a very time consuming process. Thus, leveraging the use of a pseudo-time step the code iteratively modifies while converging on a solution to both achieve a converged physics solution and obtain the goal of flow searching or pressure equalization. This process results in a significant decrease in run time overall. The same concept used to search on flow can also be applied to fluid density, static pressure, fluid temperatures, power, or any other parameter in the thermal-hydraulics or structural physics calculation.

Neutronics calculations can also utilize an FEM mesh to determine neutronics performance for complex designs not based on "primitive" shapes.

FIGS. 4A-4D provide some graphics with output analytical information about a reactor design process.

Figure 4A:
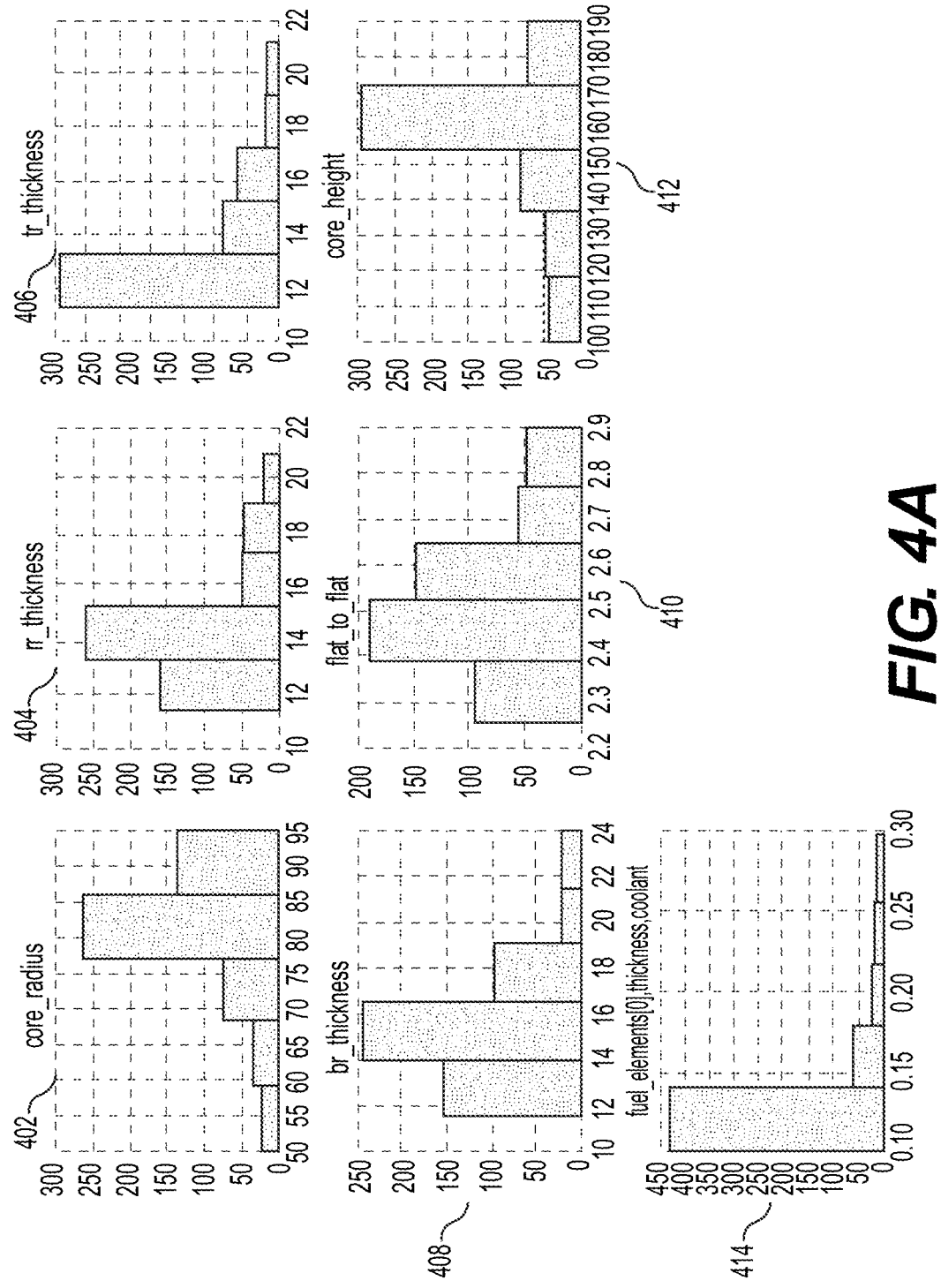

In FIG. 4A, each of the bar charts is a histogram showing the distribution os samples with respect to various design variables. For example, the first histogram 402 shows the distribution of samples with various core radii. The second histogram 404 shows the distribution of samples with respect to radial reflector thickness (rr_thickness). The third histogram 406 shows the distribution of samples with respect to top reflector thickness (tr_thickness). The fourth histogram 408 shows the distribution of samples with respect to bottom reflector thickness (br_thickness). The fifth histogram 410 shows the distribution of sample points with respect to "flat to flat", which is essentially the width of the fuel hex. The sixth distribution 412 shows the distribution of samples with respect to core height. The seventh histogram 414 shows the distribution of sample points with respect to the size of the fluid flow path.

FIG. 4B is a graphical representation that shows the correlations among a set of metric variables 112 and the total residual 420. In this example, the metric variables 112 are Inlet temperature 422, maximum fuel temperature 424, relative pressure drop 426, and the effective neutron multiplication factor 428. In each box is a number, which can range between −1 (complete negative correlation) and +1 (complete positive correlation). Of course each of the metrics is completely correlated with itself, so the boxes that represent self-correlation (such as the box 434) have a value of 1. The graphic in FIG. 4B indicates that the residual 420 is moderately correlated with maximum temperature 424 (0.42 correlation in box 430), and residual 420 is strongly correlated with relative pressure drop 426 (0.95 correlation in box 432). This graphic also indicates the inlet temperature 422 is somewhat negatively correlated with maximum temperature 424 (−0.64 correlation in box 436). In addition box 438 shows that there is a very small positive correlation of 0.09 between inlet temperature 422 and relative pressure drop 426. This graphic also include a color legend 440, which indicates how the correlation values are displayed in the boxes. In this example, higher positive or negative correlations are displayed with both greater color and greater color saturation. This enables a user to quickly see the more significant correlations.

Figure 4C:
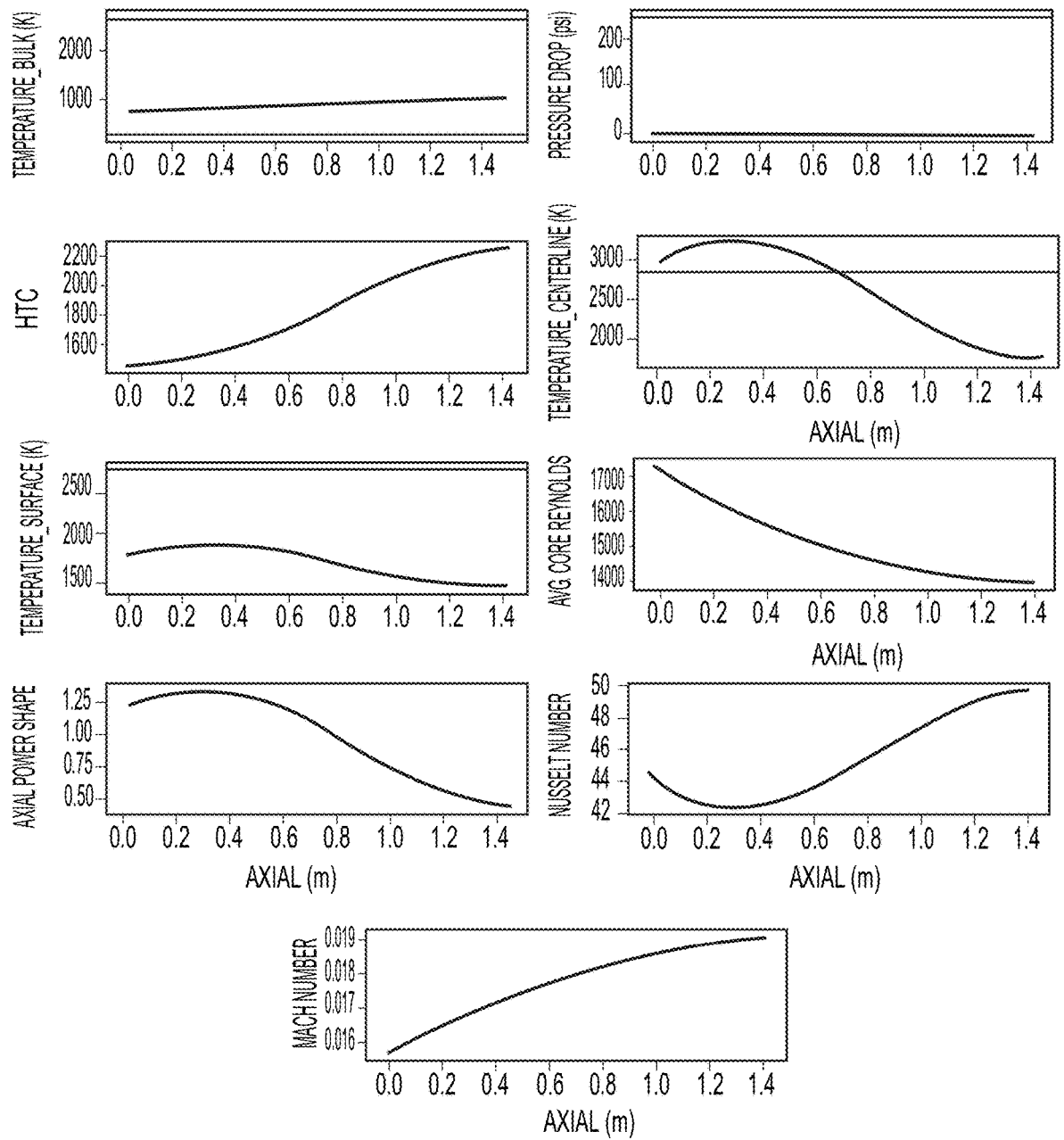

FIG. 4C illustrates some graphs generated by a thermal-hydraulic process. Each of the graphs shows a different variable plotted against axial distance. These graphs illustrate the behavior of the thermal-hydraulic calculations and allow for insight and diagnostics.

Figure 4D:
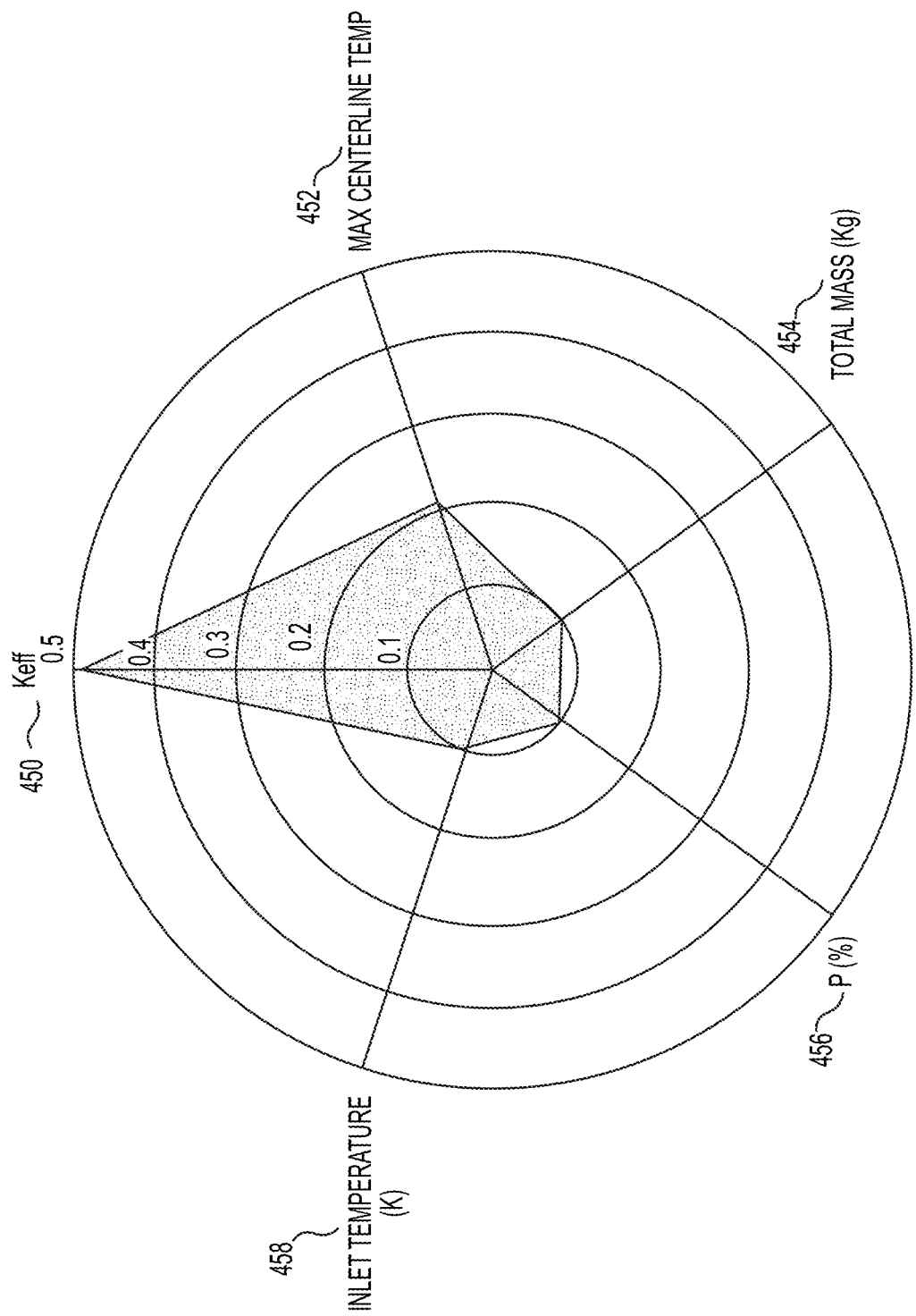

FIG. 4D illustrates the relative importance of each metric variable in computing the cost function (residual). In this example, there are five metric variables, including effective neutron multiplication factor $K_{eff}$ 450, maximum centerline temperature 452, total mass 454 (i.e., the total mass of everything for the reactor core), pressure drop 456, and inlet temperature 458. In this graphic, the relative importance of each metric to the residual calculation is scaled to make a total of 1.0, In some implementations, users can select which of the metrics to view. For example, the system typically has metrics for both pressure drop (P) as well as pressure drop relative to system pressure (dP/P). In the illustrated graphic, only pressure is displayed. As illustrated in this graphic, $K_{eff}$ 450 accounts for 50% of the residual, maximum centerline temperature 452 accounts for 20% of the residual, and each of the other metrics accounts for 10% of the residual. These percentages are aggregated based on all of the samples that have been processed.

Some implementations also include batch correlations and plots showing what happened in the previous iteration. In this way, as the optimization is running, users can see what is going on (rather than waiting until the optimization is complete).

The terminology used in the description of the invention herein is for the purpose of describing particular implementations only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A method of designing nuclear reactors, comprising:
identifying a plurality of design variables for a nuclear reactor;
identifying a multiplicity of metric variables for the nuclear reactor, including a first plurality of metric variables to measure thermal-hydraulic properties, a second plurality of metric variables to measure neutronics properties, and a third plurality of metric variables to measure stress properties;
receiving user input to specify a respective range of values for each of the plurality of design variables, thereby forming an initial trust region;
receiving user input to specify a respective threshold value for each of the multiplicity of metric variables;
constructing a Latin hypercube comprising N samples of values for design parameters within the initial trust region that minimizes the multivariate correlation between the plurality of design variables, wherein N is an integer greater than 1;
for each of the N samples in the Latin hypercube:
executing a thermal-hydraulics analysis process to compute the first plurality of metric variables that measure thermal-hydraulic properties;
executing a neutronics analysis process to compute the second plurality of metric variables corresponding to the neutronics properties;
executing a stress analysis process to compute the third plurality of metric variables corresponding to the stress properties; and
applying a cost function to compute a respective aggregate residual of the multiplicity of metric variables compared to the threshold values for the multiplicity of metric variables;
training a machine learning model according to the N samples and the corresponding computed aggregate residuals;
shrinking the initial trust region, centered at a sample of the N samples having a smallest residual, wherein the respective range for each design variable of the plurality of design variables is shrunk according to correlation between the respective design variable and estimated residuals using the machine learning model;
repeating for a plurality of iterations the constructing of the Latin hypercube, the executing of the thermal-hydraulic analysis process, the executing of the neutronics analysis process, the executing of the stress analysis process, the computing of the first, second and third pluralities of metric variables, and the training until a sample of the N samples having a smallest residual is unchanged for a predetermined number of iterations;

using the machine learning model from a final iteration to assess relative importance of each design variable of the plurality of design variables; and
providing the assessment visually in a report.

2. The method of claim 1, wherein the machine learning model is a random forest of decision trees or a neural network for Bayesian optimization.

3. The method of claim 1, wherein the machine learning model uses one or more evolutionary methods, and wherein the one or more evolutionary methods are selected from the group consisting of a genetic algorithm, a coupled simulated anneal algorithm, and a differential evolutionary algorithm.

4. The method of claim 1, wherein executing the thermal-hydraulics analysis process, executing the neutronics analysis process, and executing the stress analysis process are performed concurrently.

5. The method of claim 1, wherein executing the thermal-hydraulics analysis process, executing the neutronics analysis process, and executing the stress analysis process are performed serially.

6. The method of claim 1, wherein the thermal-hydraulics analysis process, the neutronics analysis process, and the stress analysis process are each performed at respective distinct computing subsystems.

7. The method of claim 1, further comprising during one of the plurality of iterations:
determining that the sample of the N samples having the smallest residual has a value for a first design variable on a boundary of the trust region; and
in response to the determination, expanding the trust region to include a range for the first design variable that was not previously in the trust region.

8. The method of claim 1, wherein one of the second plurality of metric variables is an effective neutron multiplication factor ($K_{eff}$).

9. The method of claim 1, wherein shrinking the trust region uses a learning rate multiplier specified by user input.

10. The method of claim 1, wherein an initial Latin hypercube is centered at average values for the user-specified ranges of the plurality of design variables.

11. The method of claim 1, wherein the plurality of design variables includes a first design variable that has discrete categorical values, the method further comprising:
encoding each discrete categorical value as a numeric value in a continuous range to form a first replacement design variable; and
substituting the first replacement design variable for the first design variable.

12. The method of claim 11, further comprising, during each of the plurality of iterations:
for the sample of the N samples having the smallest residual, estimating probabilities that switching to different categorical values would produce a smaller residual according to the cost function; and
for an immediately subsequent iteration, using sampling rates for the Latin hypercube that are proportional to the estimated probabilities.

13. The method of claim 11, wherein the first design variable is fluid type or material type.

14. The method of claim 13, wherein the discrete categorical values for fluid type or material type are selected from a database of materials including single phase gases, liquids, and solids.

15. A computing system, comprising:
one or more computers, each having one or more processors and memory, wherein the memory stores one or more programs configured for execution by the one or more processors, the one or more programs comprising instructions for:
identifying a plurality of design variables for a nuclear reactor;
identifying a multiplicity of metric variables for the nuclear reactor, including a first plurality of metric variables to measure thermal-hydraulic properties, a second plurality of metric variables to measure neutronics properties, and a third plurality of metric variables to measure stress properties;
receiving user input to specify a respective range of values for each of the plurality of design variables, thereby forming an initial trust region;
receiving user input to specify a respective threshold value for each of the multiplicity of metric variables;
constructing a Latin hypercube comprising N samples of values for design parameters within the initial trust region that minimizes the multivariate correlation between the plurality of design variables, wherein N is an integer greater than 1;
for each of the N samples in the Latin hypercube:
executing a thermal-hydraulics analysis process to compute the first plurality of metric variables that measure thermal-hydraulic properties;
executing a neutronics analysis process to compute the second plurality of metric variables corresponding to the neutronics properties;
executing a stress analysis process to compute the third plurality of metric variables corresponding to the stress properties; and
applying a cost function to compute a respective aggregate residual of the multiplicity of metric variables compared to the threshold values for the multiplicity of metric variables;
training a machine learning model according to the N samples and the corresponding computed aggregate residuals;
shrinking the initial trust region, centered at a sample of the N samples having a smallest residual, wherein the respective range for each design variable of the plurality of design variables is shrunk according to correlation between the respective design variable and estimated residuals using the machine learning model;
repeating for a plurality of iterations the constructing of the Latin hypercube, the executing of the thermal-hydraulic analysis process, the executing of the neutronics analysis process, the executing of the stress analysis process, the computing of the first, second and third pluralities of metric variables, and the training until a sample of the N samples having a smallest residual is unchanged for a predetermined number of iterations;
using the machine learning model from a final iteration to assess relative importance of each design variable of the plurality of design variables; and
providing the assessment visually in a report.

16. The computing system of claim 15, wherein the machine learning model is a random forest of decision trees or a neural network for Bayesian optimization.

17. The computing system of claim 15, wherein the machine learning model uses one or more evolutionary methods, and wherein the one or more evolutionary methods are selected from the group consisting of a genetic algorithm, a coupled simulated anneal algorithm, and a differential evolutionary algorithm.

18. The computing system of claim 15, wherein one of the second plurality of metric variables is an effective neutron multiplication factor ($K_{eff}$).

19. The computing system of claim 15, wherein the plurality of design variables includes a first design variable that has discrete categorical values, the method further comprising:
- encoding each distinct discrete categorical value as a numeric value in a continuous range to form a first replacement design variable; and
- substituting the first replacement design variable for the first design variable.

20. The computing system of claim 19, further comprising, during each of the plurality of iterations:
- for the sample of the N samples having the smallest residual, estimating probabilities that switching to different categorical values would produce a smaller residual according to the cost function; and
- for an immediately subsequent iteration, using sampling rates for the Latin hypercube that are proportional to the estimated probabilities.

* * * * *